(12) United States Patent
Aita et al.

(10) Patent No.: US 6,281,496 B1
(45) Date of Patent: Aug. 28, 2001

(54) OBSERVING/FORMING METHOD WITH FOCUSED ION BEAM AND APPARATUS THEREFOR

(75) Inventors: Kazuo Aita; Yasuhiko Sugiyama, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/360,775

(22) Filed: Jul. 26, 1999

(30) Foreign Application Priority Data

Jul. 27, 1998 (JP) .................................................. 10-211223

(51) Int. Cl.[7] .................................................. H01J 37/317
(52) U.S. Cl. .................................................. 250/309
(58) Field of Search .................................... 250/309, 306, 250/307, 492.21, 492.2, 492.3

(56) References Cited

U.S. PATENT DOCUMENTS 5,591,470 * 1/1997 Komano et al. ...................... 250/309
5,854,488 * 12/1998 Aita ...................................... 250/309

* cited by examiner

Primary Examiner—Kiet T. Nguyen
(74) Attorney, Agent, or Firm—Adams & Wilks

(57) ABSTRACT

A method for obtaining an image of a sample surface using a charged particle beam apparatus without damaging the sample surface is performed by scanning a focused ion beam onto an observation region of the sample surface, detecting secondary charged particles emanating from the sample surface, and producing an image in response thereto. The sample is placed in a water vapor atmosphere while being scanned by the focused ion beam so that a water vapor absorption layer is formed in the observation region of the sample surface. A SIM image is obtained by placing the periphery of the portion to be processed into a water vapor atmosphere and then irradiating and scanning across the sample surface with the focused ion beam in order to prevent damage to the sample surface. In one embodiment, a focused ion beam instrument is used to observe and repair a photomask without damaging the underlying substrate or to the photomask pattern during observation.

19 Claims, 2 Drawing Sheets

OBSERVING/FORMING METHOD WITH FOCUSED ION BEAM AND APPARATUS THEREFOR

BACKGROUND OF THE INVENTION

The present invention relates to a method and apparatus for preventing the surface of a sample from being damaged due to ion beam irradiation upon obtaining a sample observation image using a focused ion beam (FIB), and more particularly to an observation method and processing method suited for repairing a semiconductor photomask and an apparatus therefore.

The existence of the scanning ion microscope (SIM) is widely known together with the electron microscope as a microscope with high magnification. Although principally analogous to a scanning electron microscope (SEM), there are great differences in that, instead of electrons, ions are irradiated as a beam onto a surface of the sample and secondary charged particles emitted from the surface of the sample are not limited to electrons but include ions. Due to the difference in the emitted secondary charged particles, the scanning image based on the detected particles (SEM image and SIM image) differs in resolution sensitivity depending on the sample material. Accordingly, an ion beam microscope is selected where a SIM image is more distinct for the kind of a sample to be examined than a SEM image. In order to enable comparison and consideration of both types of scanning images, and thereby enabling more detailed observation, both microscope images are often obtained.

The focused ion beam apparatus has been put into use in semiconductor-related fields for ten-plus years, and its history is not extensive. However, the recent advancement in ion optical system basic performance capabilities is conspicuous, and it has become possible to obtain a high degree brightness and high resolving power apparatuses for use as observation microscopes and high accuracy apparatuses as processing apparatuses. First, the essentials of the scanning ion microscope apparatus, which is a prerequisite technology for the present invention, will be explained using FIG. 4 as reference. Reference numeral 1 is an ion source (e.g. Ga liquid metal), 2 is an ion beam, 3 is an electrostatic optical system formed by a capacitor lens 31, beam blanker 32, aligner 33, movable restriction 34, stigmator/aligner 35, objective lens 36 and deflector 37, 5 is a gas injector, 6 is a secondary charged particle detector, and 7 is a sample.

When a focused ion beam apparatus is used to conduct processing with high accuracy, it is necessary to specify the processing point in advance of processing or to take a SIM image in order to accurately define the processing area. This requires irradiation by an ion beam to the sample. The ion beam irradiation causes unintentional damage to the sample which has been a problem. Conventionally, to prevent such damage the only effort made has been to restrain ion beam irradiation amount to the greatest possible extent. No measure has been taken to solve the crux of the problem.

As stated before, in the case of a scanning ion microscope, the sample surface being damaged by ion beam scanning conducted for obtaining a microscope image is a problem. That is, as opposed to the electron beam of an electron microscope, the ion microscope uses charged particles of larger mass to create an ion beam directed at the sample surface and hence there is a far greater momentum at the time of bombardment than in the case of electrons. Due to this, there are problems such as damage to the sample surface by the sputtering phenomenon, change in the sample material caused by ion implantation into the sample, and so on. The purpose of the present invention is to provide a method that does not damage a sample when it is irradiated by an ion beam to obtain a SIM image, and an apparatus to carry out the inventive method.

In particular, a correction method and an apparatus therefor is provided which does not cause damage to the underlying substrate or the pattern due to ion beam irradiation in order to obtain a SIM image conducted prior to processing when conducting defect correction of a semiconductor photo mask by using an ion beam.

SUMMARY OF THE INVENTION

When obtaining an observation image of the surface of a sample by scanning a focused ion beam and detecting secondary charged particles emitted from the surface of the sample, the sample is placed in a water vapor atmosphere to form a water vapor absorption layer in the observation area of the surface of the sample whereupon ion beam scanning is performed. In particular, when a defect of a photo mask is being corrected by ion beam irradiation, in order to prevent the underlying substrate or the pattern from being damaged by ion beam scanning for obtaining a sample observation image prior to processing, the periphery of the part to be processed is put in a water vapor atmosphere when the ion beam is irradiated to obtain a SIM image.

The present invention is intented to prevent the surface of a sample from being ion-beam-etched during ion beam scanning by putting the periphery of the sample for which a SIM image is to be obtained in a water vapor atmosphere. The phenomenon that a sample located within a water vapor atmosphere has a water vapor gas absorption layer formed upon its surface, acting as a protective layer to thereby prevent damage due to ion beam irradiation is utilized.

Also, if this method is applied to a case of correcting a photo mask defect by ion beam irradiation, not only is the surface of the sample prevented from being damaged due to ion beam irradiation upon initial observation but also the essential optical characteristics of the photo mask are prevented from being changed. This is because in the present invention a water vapor absorption layer is formed on the surface of the sample so that implant or etching is blocked, allowing no effect upon the optical characteristics, solving the conventional problem that since a photo mask generally has a pattern formed of chromium, molybdenum silicide or the like on a glass substrate, if an ion beam is directly irradiated to a glass substrate, the Ga used as ions is implanted in the substrate to worsen the pattern's optical characteristics, for example by degrading glass transparency, increasing pattern reflectivity, or changing the phase.

Figure 1:
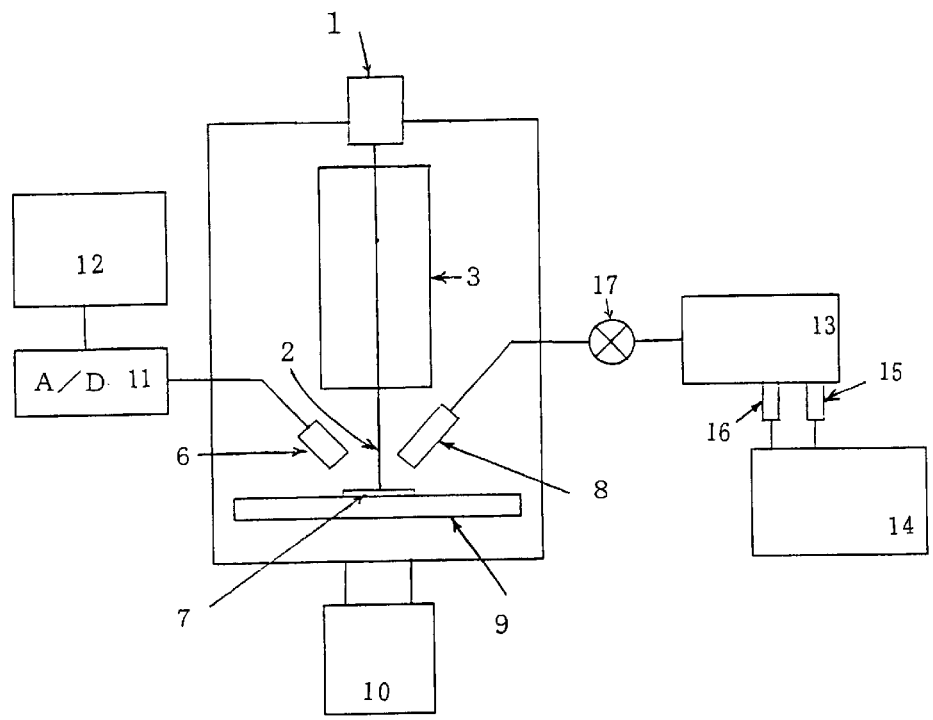
FIG. 1 is a view showing an example of an apparatus for embodying the present invention.

Descriptions of the Reference Numerals are as follows:

1 . . . ion source, 2 . . . ion beam, 3 . . . electrostatic optical system, 31 . . . capacitor lens, 32 . . . beam blanker, 33 . . . aligner, 34 . . . movable iris diaphragm, 35 . . . stigmator/aligner, 36 . . . objective lens, 37 . . . deflector, 5 . . . gas injector, 6 . . . secondary charged particle detector, 7 . . . sample, 8 . . . gas discharge port, 9 . . . stage, 10 . . . vacuum pump, 11 . . . A/D converter, 12 . . . display device, 13 . . . reservoir (containing hydrate salt), 14 . . . temperature controller, 15 . . . temperature sensor, 16 . . . heater, 17 . . . valve, 18 . . . reservoir (for water), 19 . . . pressure controller, 20 . . . gas reservoir, 21 . . . vacuum gauge, 22 . . . control valve, 40 . . . water vapor source, 41 . . . assist gas source.

DETAILED DESCRIPTION OF THE INVENTION

FIG. 1 shows an embodiment of the present invention. Reference numeral 1 is a Ga liquid metal ion source, 2 is an ion beam, 3 is an electrostatic ion optical system, 7 is a sample, 9 is a stage for placing thereon a sample, and 10 is a vacuum pump for evacuating a sample chamber. Reference numeral 6 is a detector for detecting secondary charged particles emitted from a sample surface by ion beam irradiation, 11 is an A/D converter for the detection signal, and 12 is a display unit to display an image based on the detected signal. This embodiment is an apparatus for a case of using a hydrate salt as a water vapor source wherein 13 is a reservoir accommodating a hydrate salt, 14 is a temperature controller for controlling a heater 16 depending on the in-reservoir temperature detected by a temperature sensor 15, 17 is a valve on the water vapor supply line, and 8 is a gas emission port for giving off water vapor.

In order to obtain an observation image by a scanning ion microscope, the air in the sample chamber is pumped out to produce a vacuum environment, and the temperature controller 14 is driven to heat up the reservoir 13 so that water content is separated and evaporated from the hydrate salt (e.g. iron iodide, etc.) accommodated in the reservoir. A valve 17 is opened to blow vaporized water vapor through a gas emission port 8 to the surface of the sample. The blowing in this case is done such that the entire observation region is enveloped by a water vapor atmosphere instead of locally blowing a gas to the sample, for example by blowing with an assist gas during processing. Accordingly, the discharge port 8 is not necessarily a gas injector but may be a mere opening. When a water vapor absorption layer is formed over the sample surface, an ion beam is irradiated. Ga ions are passed through the optical system 3 into an ion beam 2 which is deflection-driven by a deflector not shown in FIG. 1 and raster scanned over the surface of the sample 7. As a result of this ion beam irradiation, secondary charged particles are driven out of the surface of the sample. The particles are captured by the secondary charged particle detector 6 and detected. The charge signal of the detected secondary charged particles is converted into a digital value by the A/D converter 11 and displayed as a SIM image on the CRT display unit 12.

According to the present invention, because the ion beam at this time is irradiated to the surface of the sample through the water vapor absorption layer, the absorption layer acts as a protective layer so that there is less possibility of inflicting damage to the surface of the sample. Also, the phenomenon of ion implantation into the sample is prevented due to this absorption layer. Where this defect correction in a semiconductor photo mask is performed using an ion beam, Ga implant or etching due to ion beam scanning for an observation SIM image prior to processing is prevented. The glass which is the underlying substrate is not impaired in transparency and the pattern's optical characteristics are not degraded.

Figure 2:
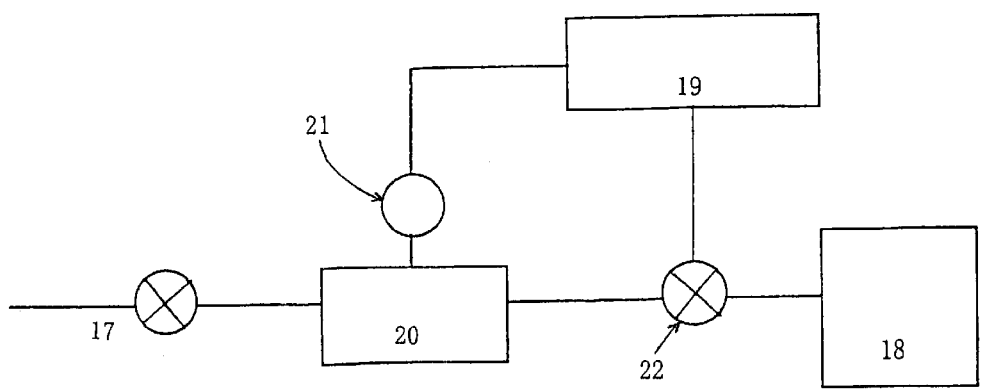
FIG. 2 is a view showing a modified example of an apparatus for embodying the present invention.

FIG. 2 shows a modification of a water vapor supply system section. Where as the former embodiment showed a method of obtaining water vapor by heating up the hydrate salt, thereby effecting separation and evaporation of water, this embodiment is a method of obtaining water vapor by causing water to evaporate. The water vapor from a reservoir 18 basically similar to a boiler is accumulated in a gas reservoir 20 through a control valve 22 that is controlled by a pressure controller 19, and sent to a gas radiation port via valve 17. The pressure in the gas reservoir 20 is monitored by a vacuum gauge 21 and this information is transmitted to the aforesaid pressure controller 19. The air in the sample chamber is evacuated to a low pressure, whereas the pressure within the reservoir 18 is at high pressure so that the water vapor thereof cannot be directly discharged to the inside of the sample chamber. Accordingly, a feedback control system is structured so that the pressure is detected by the vacuum gauge 21, in the pressure controller 19 a drive signal is calculated and transmitted to control the opening of the control valve 22, and the water vapor supply amount to the gas reservoir 20 is controlled by the timing and degree of the opening of the control valve 22 based on the above drive signal so that the gas reservoir has the appropriate pressure.

Figure 3:
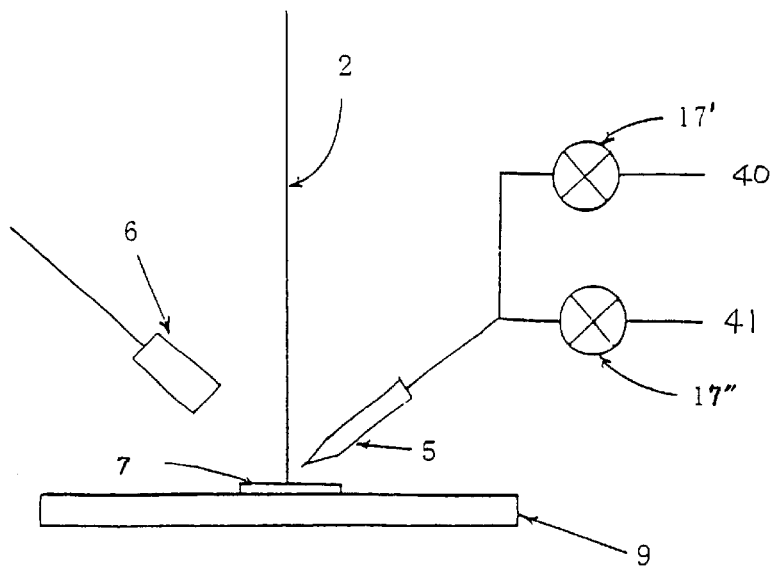
FIG. 3 is a view showing another modified example of an apparatus for embodying the present invention.
Figure 4:
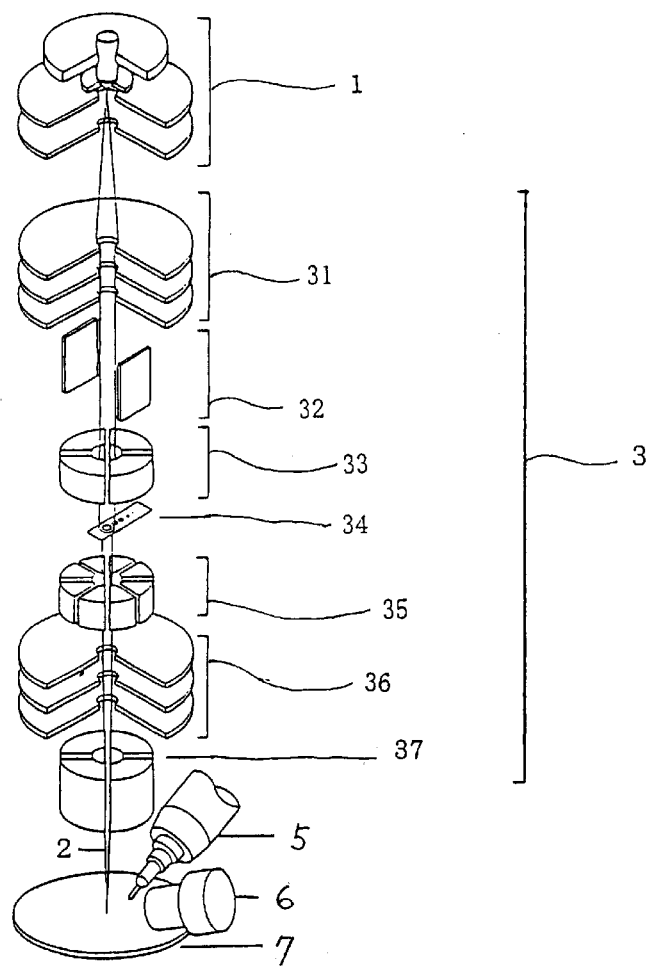
FIG. 4 is a view showing the structure of a focused ion beam apparatus.

Next, an explanation is made with reference to FIG. 3 of an embodiment serving also as a gas injector in place of a gas emission port to supply an assist gas to be used in processing. 5 is a gas injector for locally blowing an assist gas to the portion of the sample to be processed. This gas injector 5 is connected to a water vapor supply source 40 as shown in the former embodiment through a valve 17'. The assist gas source 41 is also connected in parallel to the gas injector 5 through the valve 17". Upon ion beam irradiation at the time of initial observation, the valve 17' is opened to supply water vapor through the gas emission port 8 to provide a water vapor atmosphere around the sample, similarly to the former example. If ion beam scanning for a SIM image prior to processing is ended, the valve 17' is closed and at this time the valve 17" is opened to supply an assist gas from the assist gas source 41 to the gas injector 5, thereby performing sample processing. Because the supply of water vapor and the supply of assist gas can be made to use in common the same gas injector, it is possible to simplify the inside of the small sample chamber and give it high visibility.

The present invention puts the periphery of the sample in a water vapor atmosphere before obtaining a scanning ion microscope image, to form a water vapor absorption layer over the entire observation surface, over which ion beam scanning is performed. Accordingly, the water vapor absorption layer acts as a sample protective layer for a material whose susceptibility to etching is not enhanced by water vapor (glass, chromium, molybdenum, etc.). Unintentional etching of the sample surface or ion implantation in the surface of the sample is prevented, a method of preventing physical/chemical change in a sample that will be a significant advance for the industry. Also, if the present invention is applied to correct a defect in a semiconductor photo mask using an ion beam, there is observed almost no damage to the sample due to the ion beam during SIM image observation, e.g. no lowering in glass substrate transparency due to ion implantation, and no change in pattern optical characteristics or the like. Furthermore, in an ion beam forming apparatus provided with a gas injector, an apparatus can be made simple by connecting in parallel a water vapor source and assist gas source through valves to the gas injector.

What is claimed is:

1. An observing method for obtaining an image of the surface of a sample, comprising the steps of: scanning a focused ion beam across the surface of the sample; and detecting secondary charged particles emitted from the surface of the sample; wherein the sample is placed in a water vapor atmosphere to form a water vapor absorption layer in the observation area of the sample when ion beam scanning is performed.

2. A method for repairing a photo mask, comprising the steps of: performing a treatment step of irradiating an ion beam while blowing an assist gas to a defective portion of the photo mask; and performing a pre-treatment step comprising the observing method according to claim 1, whereby the repairing method is thus both an observing method and a correction method.

3. An observing method according to claim 1; wherein the focused ion beam is produced by a focused ion beam apparatus comprising an ion beam source, an ion beam focusing system for focusing the ion beam to produce the focused ion beam and projecting the focused ion beam onto the sample surface, a scanning electrode for controlling the position of the focused ion beam with respect to the sample surface so as to cause the focused ion beam to scan across the desired region of the sample surface, and a sample support for supporting the sample.

4. An observing method according to claim 3; wherein the focused ion beam apparatus further comprises a secondary charged particle detection system disposed proximate the sample for detecting particles emitted by the sample in response to irradiation by the focused ion beam, and an image display for displaying an image based upon a charged particle intensity distribution output by the charged particle detection system.

5. In a focused ion beam apparatus a gas emission port provided to direct a gas when in a released state to a position where a sample is to be processed, the gas emission port being connected to a water vapor source so that an entire observation area of the sample can be enveloped by a water vapor atmosphere.

6. In a focused ion beam apparatus: a gas injector provided to blow a gas locally to a specific portion of a sample at a position where the sample is to be processed, the gas injector being connected in parallel with a water vapor source and an assist gas source respectively with opening and closing valves.

7. A charged particle beam apparatus comprising: a charged particle source for emitting a charged particle beam; an optical system for focusing the charged particle beam; a scanning electrode for irradiating a sample surface with the charged particle beam and scanning the charged particle beam across a desired region of the sample surface; and a gas emission port for directing a gas to the vicinity of the sample surface, the gas emission port being connected to a water vapor source so that an observation region of the sample may be enveloped in a water vapor atmosphere.

8. A charged particle beam apparatus according to claim 7; further comprising a secondary charged particle detector for detecting secondary charged particles generated in response to irradiation of the sample surface with the charged particle beam and outputting a corresponding signal, and a display unit for displaying an image of the sample surface based on the output signal of the secondary charged particle detector.

9. A charged particle beam apparatus according to claim 7; wherein the gas emission port comprises a gas injection gun for injecting a gas toward the sample surface.

10. A charged particle beam apparatus according to claim 7; further comprising an assist gas source connected in parallel with the water vapor source, and valves connecting the water vapor source and the gas source to the gas emission port.

11. A charged particle beam apparatus according to claim 7; further comprising a housing for accommodating therein the charged particle beam, the optical system and the sample.

12. A charged particle beam apparatus according to claim 7; further comprising an aperture member disposed in a path of the charged particle beam, the aperture member having a plurality of holes of different sizes therethrough and being mounted to allow any one of the plural holes to be placed in the path of the charged particle beam.

13. A charged particle beam apparatus according to claim 7; further comprising a blanking electrode for turning the charged particle beam on or off.

14. A charged particle beam apparatus according to claim 7; wherein the optical system has at least one focusing lens for focusing the charged particle beam emitted by the charged particle source.

15. A charged particle beam apparatus according to claim 7; wherein the charged particle beam comprises an ion beam.

16. A charged particle beam apparatus comprising: a housing; a charged particle source contained in the housing for emitting charged particles; an optical system contained in the housing for focusing the charged particles to produce a charged particle beam; a scanning electrode contained in the housing for scanning the charged particle beam across a desired region of a sample surface; a gas emission port for directing a gas to the vicinity of the sample surface, the gas emission port being connected to a water vapor source so that an observation region of the sample may be enveloped in a water vapor atmosphere; a secondary charged particle detector for detecting secondary charged particles generated in response to the irradiation of the charged particle beam and outputting a corresponding signal; and a display for displaying an image of the sample surface based on the output signal of the secondary charged particle detector.

17. A charged particle beam apparatus according to claim 16; wherein the optical system has at least one focusing lens for focusing the charged particles emitted by the charged particle source.

18. A charged particle beam apparatus according to claim 16; further comprising an assist gas source connected in parallel with the water vapor source, and valves connecting the water vapor source and the gas source to the gas emission port.

19. A charged particle beam apparatus according to claim 18; wherein the assist gas cooperates with the charged particle beam irradiated onto the sample surface to modify a desired region of the sample surface irradiated by the charged particle beam.

* * * * *